United States Patent [19]
Fouts et al.

[11] Patent Number: 5,926,038
[45] Date of Patent: Jul. 20, 1999

[54] TWO-PHASE DYNAMIC LOGIC CIRCUITS FOR GALLIUM ARSENIDE COMPLEMENTARY HIGFET FABRICATION

[75] Inventors: Douglas Jai Fouts, Pacific Grove, Calif.; Khaled Ali Shehata, Giza, Egypt

[73] Assignee: The United States of America as represented by the Secretary of the Navy, Washington, D.C.

[21] Appl. No.: 08/967,133

[22] Filed: Nov. 10, 1997

[51] Int. Cl.$^6$ ........................ H03K 19/096; H03K 19/094
[52] U.S. Cl. .............................. 326/95; 326/112; 326/122
[58] Field of Search ................................ 326/95–98, 112, 326/122, 119, 121

[56] References Cited

U.S. PATENT DOCUMENTS

| | | |
|---|---|---|
| 3,755,689 | 8/1973 | Elmer et al. . |
| 3,909,627 | 9/1975 | Mizuno . |
| 4,769,562 | 9/1988 | Ghisio ........................................ 326/98 |
| 4,812,685 | 3/1989 | Anceau . |
| 5,015,882 | 5/1991 | Houston et al. . |
| 5,070,262 | 12/1991 | Hashimoto ................................ 326/98 |
| 5,144,163 | 9/1992 | Matsuzawa et al. . |
| 5,208,489 | 5/1993 | Houston . |
| 5,483,181 | 1/1996 | D'Souza ..................................... 326/98 |

Primary Examiner—Jon Santamauro
Attorney, Agent, or Firm—Donald E. Lincoln

[57] ABSTRACT

A two-phase dynamic logic circuit for complementary GaAs HIGFET fabrication processes has a precharge transistor connected between a precharge voltage source and an output node of the logic circuit. The precharge transistor is controlled by a clock signal such that the output node precharges when the clock signal is low and is isolated from the precharge voltage source when the clock signal is high. An evaluate transistor connected to the output node and an NFET logic block has a first terminal connected to the evaluate transistor such that the evaluate transistor is between the NFET logic block and the output node. A second terminal of the logic block is connected to a voltage source and a data input terminal that is arranged to receive data input signals. The NFET logic block includes on or more transistor(s) is arranged to generate a logic value. The evaluate transistor is controlled by the clock signal such that when the clock signal is low, the output node is isolated form the NFET logic block, and when the clock signal is high, the logic value generated by the logic block is allowed to determine the voltage on the output node of the logic circuit. A pass-gate is arranged to receive an input signal and conditionally pass the input signal to the gate(s) of the transistor(s) in the NFET logic block under the control of the clock signal such that the input is allowed to influence the gate voltage of the evaluation transistor when the clock signal is low, but is not allowed to influence the gate voltage of the transistor(s) in the logic block when the clock signal is high.

13 Claims, 9 Drawing Sheets

TWO-PHASE DYNAMIC LOGIC CIRCUITS FOR GALLIUM ARSENIDE COMPLEMENTARY HIGFET FABRICATION

BACKGROUND OF THE INVENTION

1. Field of the Invention

This invention relates generally to high-speed, low power digital integrated circuits. More particularly, this invention relates to high-speed, low power digital integrated circuits for complementary gallium arsenide fabrication processes.

2. Description of the Prior Art

The demand for high-speed, low-power, digital integrated circuits in computers and other digital systems for spacecraft, aeronautical, mobile, portable, and weapons applications is rapidly increasing. Existing circuits provide either high performance at high power consumption or low power consumption but low performance.

Gallium arsenide (GaAs) is a compound semiconductor that can be used to fabricate field effect transistors (FETs). Like silicon (Si) FETs, GaAs FETs can be used to make both analog and digital integrated circuits (ICs). GaAs FETs have been in use in analog microwave circuits since about the late 1960s, where they provide bandwidth, noise, and power consumption advantages over available silicon devices for certain applications. GaAs FETs have been in use in digital integrated circuits since about 1974. Initially, their use was limited to extremely high-speed applications where logic density was not a major issue and where power consumption was less of a concern than operating speed.

Today, the use of GaAs FET digital ICs is very common in high-performance digital systems. The speed of GaAs FET logic has surpassed the speed of Si Complementary Metal Oxide Semiconductor (CMOS) logic, Si Bipolar Complementary Metal Oxide Semiconductor (BiCMOS) logic, and Emitter Coupled Logic (ECL) implemented with silicon bipolar junction transistors (BJTs), for ICs of comparable functionality and power consumption.

There are three types of GaAs FETs that can be used for fabricating digital integrated circuits. The most common type is the Metal Semiconductor Field Effect Transistor, or MESFET. These transistors are significantly different from the more familiar silicon (Si) Metal Oxide Semiconductor FET (MOSFET). The second most common type of GaAs transistor is the Hetero Structure Isolated Gate Field Effect Transistor, or HIGFET. Although current technology is only capable of fabricating N-channel MESFETs, most HIGFET processes are capable of fabricating both N-channel and P-channel devices. These HIGFET processes are often known as C-HIGFET or CGaAs fabrication processes because of the availability of complementary transistors. The third type of GaAs FET that can be used for implementing logic circuits is the junction FET, or JFET. This transistor should not be confused with the Si JFET. The Si JFET is very common in low-frequency analog integrated circuits. However, GaAs JFETs have never had any significant advantages over other, more established technologies.

SUMMARY OF THE INVENTION

The two-phase, dynamic logic circuits according to the present invention for use with complementary gallium arsenide (CGaAs) fabrication processes provide both high performance and low power consumption. These logic circuits have a significant advantages over the best previously existing circuits for use in high-speed, low power computers and other digital systems. The most widely used and accepted metric for evaluating performance and power consumption is the logic propagation delay-power consumption product. Using this metric, the logic circuits according to the present invention are as must as thirty times better than the best previously existing circuits. These new logic circuits are extremely attractive for use in computers and other digital systems in spacecraft, aeronautical, portable, mobile, and weapons applications. The newly developed circuits are 100% compatible with existing commercial integrated circuit software design tools and methods. They are also 100% compatible with existing commercial CGaAs fabrication processes.

The new logic circuits described in this disclosure of invention are specifically designed for use with C-HIGFET fabrication processes and are significantly different from their distant relatives which are specifically designed for use with MESFET fabrication processes. These new circuits are not compatible with any known MESFET process but are compatible with all known C-HIGFET fabrication processes.

An appreciation of the objectives of the present invention and a more complete understanding of its structure and method of operation may be had by studying the following description of the preferred embodiment and by referring to the accompanying drawings.

DESCRIPTION OF THE PREFERRED EMBODIMENT

This invention relates to two-phase, dynamic logic circuits for use with complementary gallium arsenide (CGaAs) fabrication processes to provide logic circuits having both high performance and low power consumption. Specific details are disclosed to provide a thorough description of the invention. However, it will be apparent that the present invention may be practiced without these specific details. Well-known components are shown in block diagram form, rather than in detail, to avoid unnecessarily obscuring the invention. Descriptions of prior art logic circuits are presented to facilitate an understanding of the present invention. The most common prior art logic circuits for use with GaAs C-HIGFET processes are Complementary Static Logic, or CSL, Directly Coupled FET Logic, or DCFL, and Source-Coupled FET logic, or SCFL.

Figure 1:
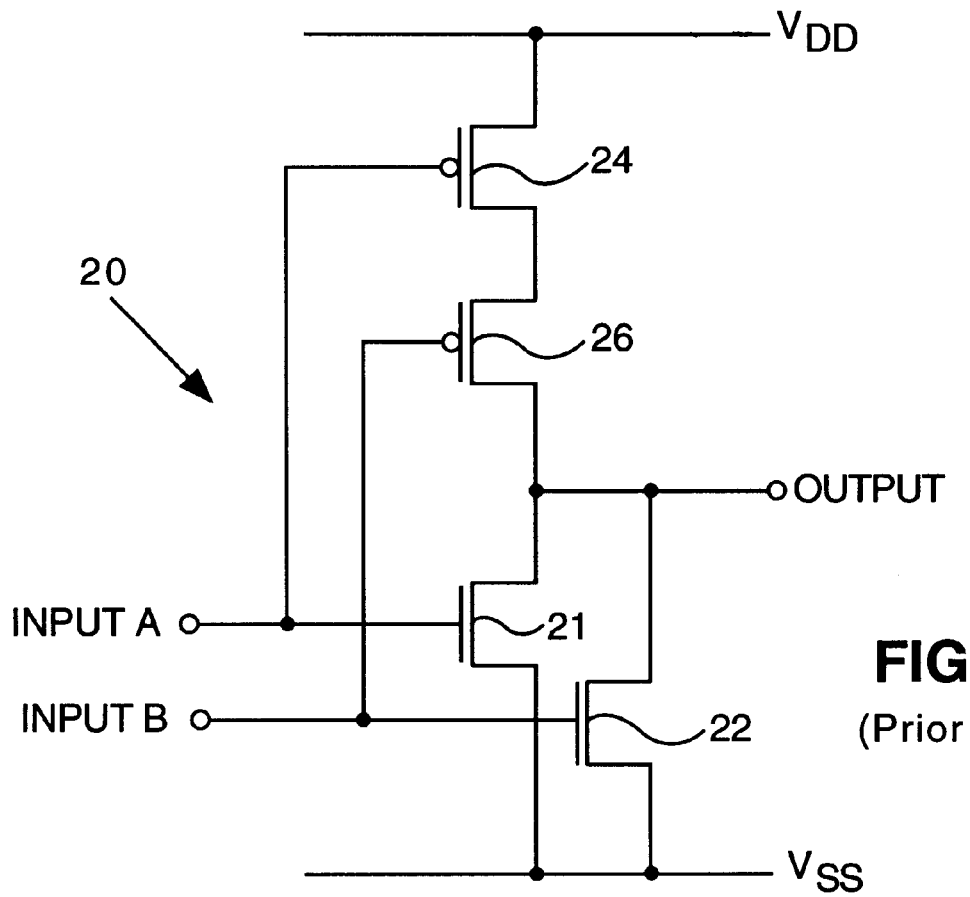
FIG. 1 schematically illustrates a prior art GaAs C-HIGFET complementary static logic (CSL) 2-input NOR gate.

A schematic diagram of a CSL 2-input NOR gate 20 is shown in FIG. 1. A pair of N-type HIGFETs (NFETs) 21 and 22 are connected with their sources and drains in parallel between $V_{SS}$ and the output node of the circuit. The gate of the NFET 21 is connected to input A to the logic circuit. Similarly, the gate of the NFET 22 is connected to input B to the logic circuit. The sources and drains of a pair of P-type FETs (PFETs) 24 and 26 are connected in series between $V_{DD}$ and the output node. The gates of the PFETs 24 and 26 are also connected to the logic circuit inputs A and B, respectively.

If either of the two inputs to the circuit go high, then at least one of the two NFETs 21 and 22 will be turned on, and the output will be pulled down to $V_{SS}$. Furthermore, the output will be isolated from $V_{DD}$ because at least one of the two PFETs 24 and 26 will be turned off. The output can be pulled high only if both inputs are low. For this combination of inputs, both PFETs 24 and 26 will be on and both NFETs 21 and 22 will be off. Thus, the Boolean NOR function is generated by the circuit in FIG. 1. It should be noted that although the power dissipation of this circuit is low relative to other circuits that will be described subsequently herein, the speed of operation is low because PFETs are used to generate the logic function and pull the output node high. This is a serious problem in most logic circuits for C-HIGFET fabrication processes because PFETs have approximately one-third the transconductance and one-third the speed of the NFETs.

Figure 2:
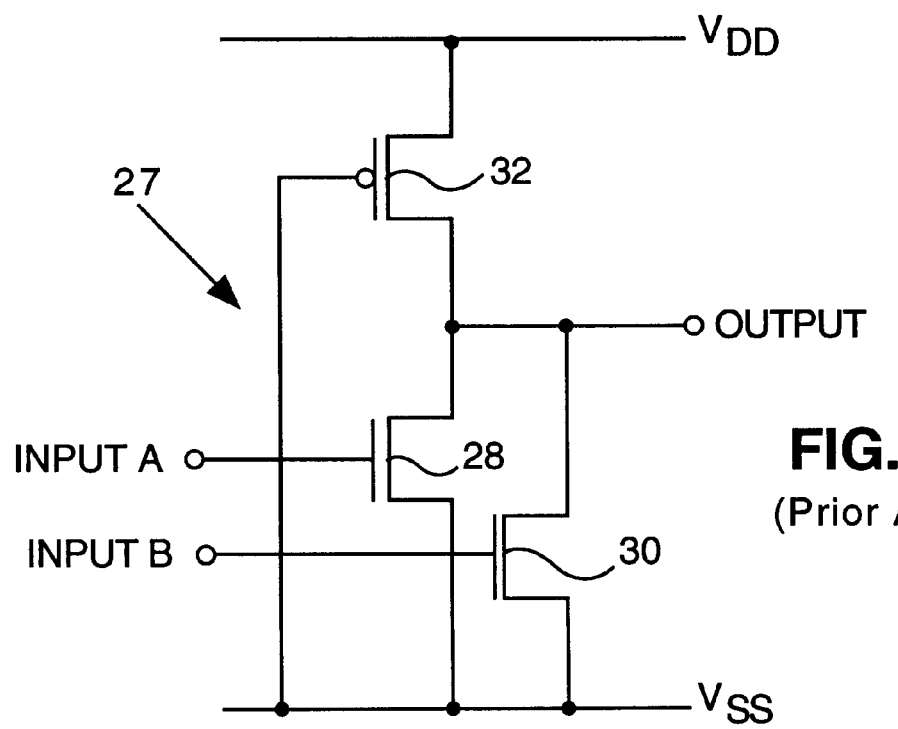
FIG. 2 schematically illustrates a prior art GaAs C-HIGFET directly-coupled FET (DCFL) 2-input NOR gate.

A DCFL 2-input NOR gate 27 implemented with C-HIGFETs is shown in FIG. 2. The NOR gate 27 comprises a pair of NFETs 28 and 30 and a single PFET 32. The drains of the NFETs 28 and 30 are connected to the output node of the NOR gate 27. The gates are connected to the input nodes A and B, respectively, and the sources are connected to $V_{SS}$. The source of the PFET 32 is connected to $V_{DD}$, and the drain of the PFET 32 is connected to the output node of the NOR gate 27. The gate of the PFET 32 is connected to $V_{SS}$ which causes the PFET 32 to always be in the on state. Thus, the PFET 32 acts as a resistor pull-up to $V_{DD}$ and is sometimes referred to as an active load.

For the NOR gate 27 shown in FIG. 2, if either input to the circuit is high then at least one of the two NFETs will be turned on and the output voltage will be pulled low. Note that this causes a large current to flow from $V_{DD}$ to $V_{SS}$ and thus causes a high power dissipation. Both NFETs must be turned off to allow the output voltage to be pulled high by the PFET pull-up transistor, thus generating the Boolean NOR function.

Figure 3:
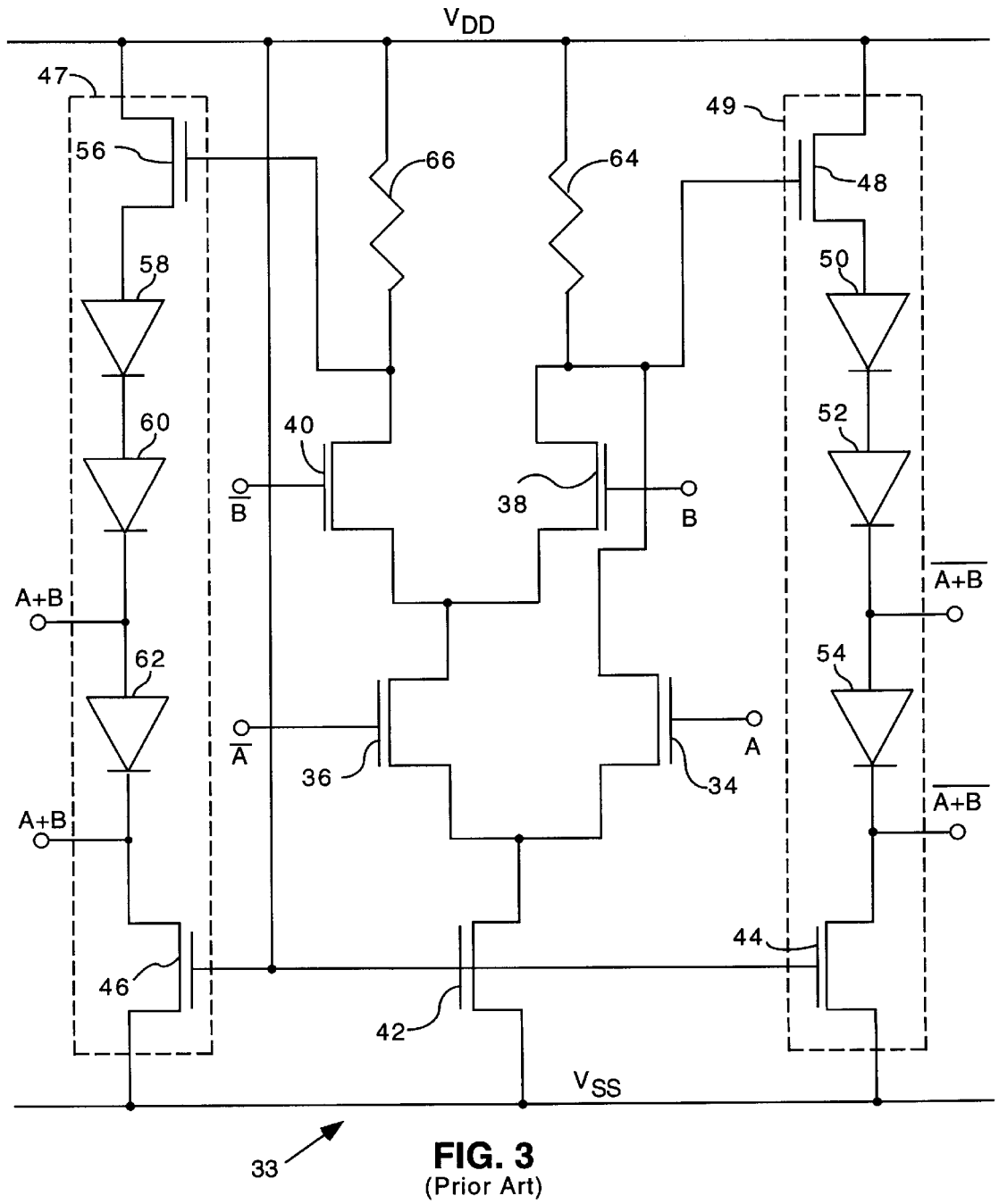
FIG. 3 schematically illustrates a prior art GaAs source-coupled FET logic (SCFL) 2-input OR/NOR gate.

FIG. 3 shows an SCFL 2-input OR/NOR gate 33 implemented with GaAs C-HIGFETs. The OR/NOR gate 33 is constructed with all NFETs because they have a transconductance that is approximately three times greater than that of PFETs and thus yield a higher speed circuit. The part of the circuit that actually generates the logic function utilizes a first differential pair of NFETS 34 and 36 and a second differential pair of NFETS 38 and 40. The A and $\overline{A}$ inputs are applied to the differential NFETS 34 and 36 and the B and $\overline{B}$ inputs are applied to differential NFETS 38 and 40. The complements of all input signals are required to maintain good DC balance, noise margins, and high-speed operation. Thus, the use of SCFL in an integrated circuit can double the required interconnect area, compared to the use of CSL or DCFL.

In FIG. 3, the NFET 42 acts as a current source to bias the differential pairs of NFETS 34/36 and 38/40. The NFETS 44 and 46 are two more current sources that are used to bias the output source follower/level shifter stages 47 and 49. The source follower/level shifter output stage 49 includes a series connection of an NFET 48, a diode 50, a diode 52, a diode 54 and the NFET 44 for the NOR output. The source follower/level shifter output stage 47 includes a series connection of an NFET 56, a diode 58, a diode 60, a diode 62 and the NFET 46 for the OR output.

The output source follower/level shifter stages 47 and 49 have a positive gain that is slightly less than unity and they are required for two reasons. First, they reduce the loading on the differential pairs 34/36 and 38/40 and improve the output drive capability, thus maintaining high speed. Second, they are required for voltage shifting. The output voltage swing of the differential pairs 34/36 and 38/40 is more positive than the input voltage swing. The source follower/voltage shifters 47 and 49 shift down the output voltage swing to the point where it is compatible with the input voltage swing of the next stage. The number of diodes required in the voltage shifter varies, depending on the bias points of the circuit and on which input is being driven in the next logic stage. For example, if inputs A and $\overline{A}$ of the next stage are being driven, then the outputs at the drains of NFETS 44 and 46 are used. If inputs B and $\overline{B}$ are being driven, then the outputs between the diodes 52 and 54 and the diodes 60 and 62 are used.

Referring to FIG. 3, if both the A and B inputs are low, then the currents through the NFETS 34 and 38 are reduced and the current through the NFETS 36 and 40 increases. This decreases the voltage drop across resistor 64 and increases the voltage drop across resistor 66, which raises the voltage on the gate of the NFET 48 and lowers the voltage on the gate of the NFET 56. The voltages at the gates of the NFETS 48 and 56 are shifted down the required amount by the previously described voltage shifting circuits.

If input A is high and input B is low, then the current through the NFET 34 increases and the current through the NFET 36, the NFET 40, and the NFET 38 decreases. This increases the voltage drop across resistor 64 and decreases the voltage drop across resistor 66, which lowers the voltage at the gate of the NFET 48 and raises the voltage at the gate of the NFET 56. If input A is low and input B is high, then the currents through the NFET 34 and the NFET 40 decrease and the current through the NFET 36 and the NFET 38 increases. This increases the voltage drop across the resistor 64 and decreases the voltage drop across the resistor 66, which lowers the voltage at the gate of the NFET 48 and raises the voltage at the gate of the NFET 56. If inputs A and B are both high, then the current through the NFET 34 increases and the current through the NFET 36, the NFET 40, and the NFET 38 decreases. This increases the voltage drop across resistor 66 and decreases the voltage drop across the resistor 64, which lowers the voltage at the gate of the NFET 48 and raises the voltage at the gate of the NFET 56. Thus, the Boolean NOR function is implemented at the gate of the NFET 48, and the Boolean OR function is implemented at the gate of the NFET 56. Although the speed of the OR/NOR gate 33 of FIG. 3 is significantly faster than that of the circuits in FIGS. 1 and 2, the power consumption of SCFL is much higher because current is always flowing in the differential pairs 34/36 and 38/40 and in the level shifting circuits 47 and 49.

Figure 4:
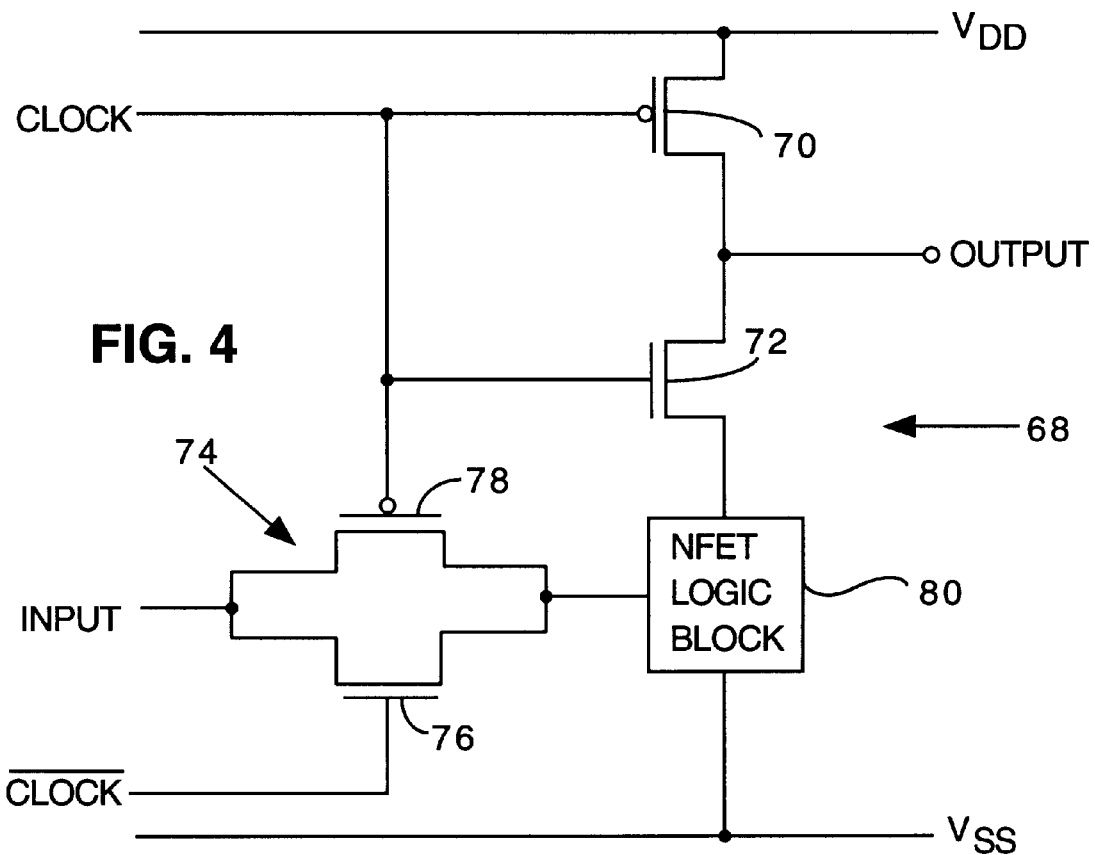
FIG. 4 schematically illustrates a generic GaAs C-HIGFET two-phase dynamic logic (TPDL) gate according to the present invention.

The basic circuit of a Two-Phase Dynamic Logic (TPDL) gate 68 is shown in FIG. 4. It comprises a PFET precharge transistor 70, an NFET evaluate transistor 72, an NFET logic block 80 and one or more combination NFET/PFET pass-gate input circuits 74 that comprise a PFET 78 and an NFET 76. A clock signal is applied to the gate of the PFETs 70 and 78. A clock signal is also applied to the gate of the NFET 72. A complementary clock signal is applied to the gate of the NFET 76.

Alternatively, an NFET (not shown) could be used as the precharge transistor 70, but the use of a PFET has proven to be superior. Also, the combination NFET/PFET pass-gate input circuit 74 could be replaced with a single NFET (not shown) or a single PFET pass-gate input circuit (not shown). However, these changes would yield a decrease in performance. It should be noted that the term "transmission gate" is sometimes used in place of the term "pass gate". The NFET evaluate transistor 72 could also be connected between the NFET logic block 80 and $V_{SS}$, rather than between the NFET logic block 80 and the output node. The NFET evaluate transistor could also be replaced with a PFET (not shown). Again, the circuit topology shown in FIG. 4 has been shown to be superior.

Figure 5:
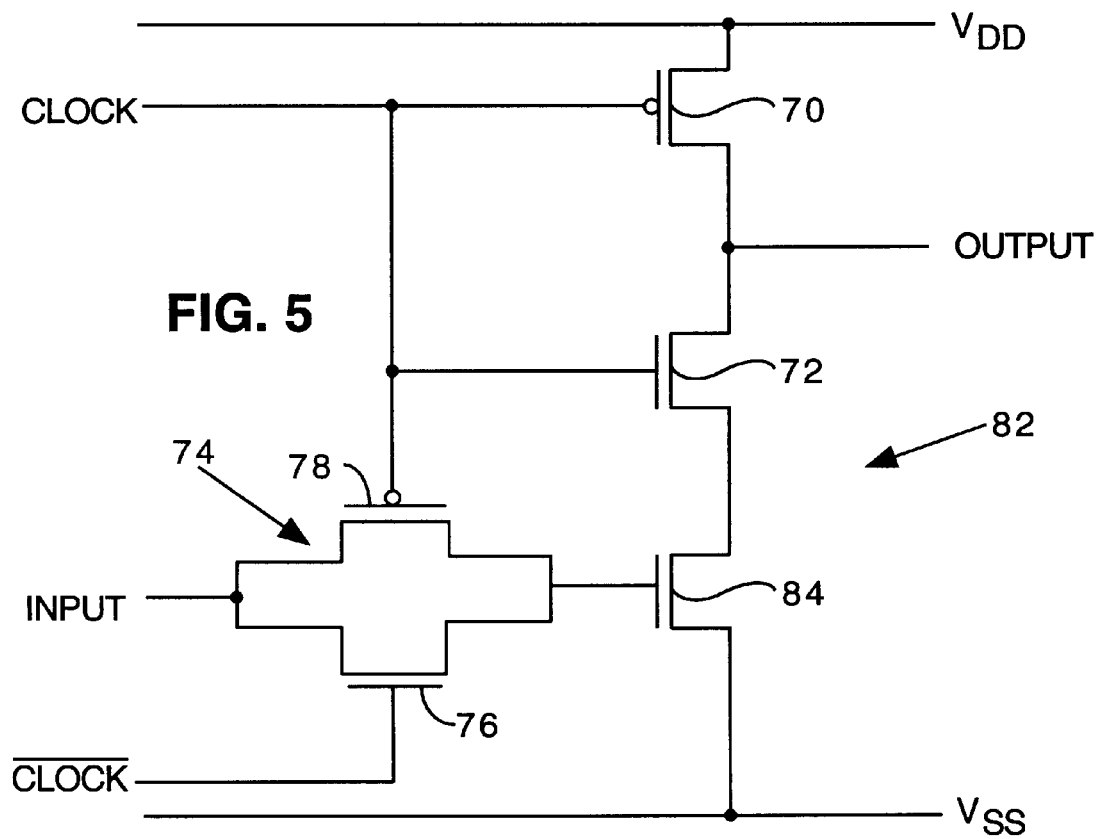
FIG. 5 schematically illustrates a GaAs C-HIGFET TPDL gate that performs the inverter logic function according to the present invention.

The NFET logic block 80 can be any combination of NFETs that generates the desired logic function. For example, the circuit shown in FIG. 5 implements an inverter 82 by using an NFET 84 as the logic block 80 of FIG. 4.

Figure 6:
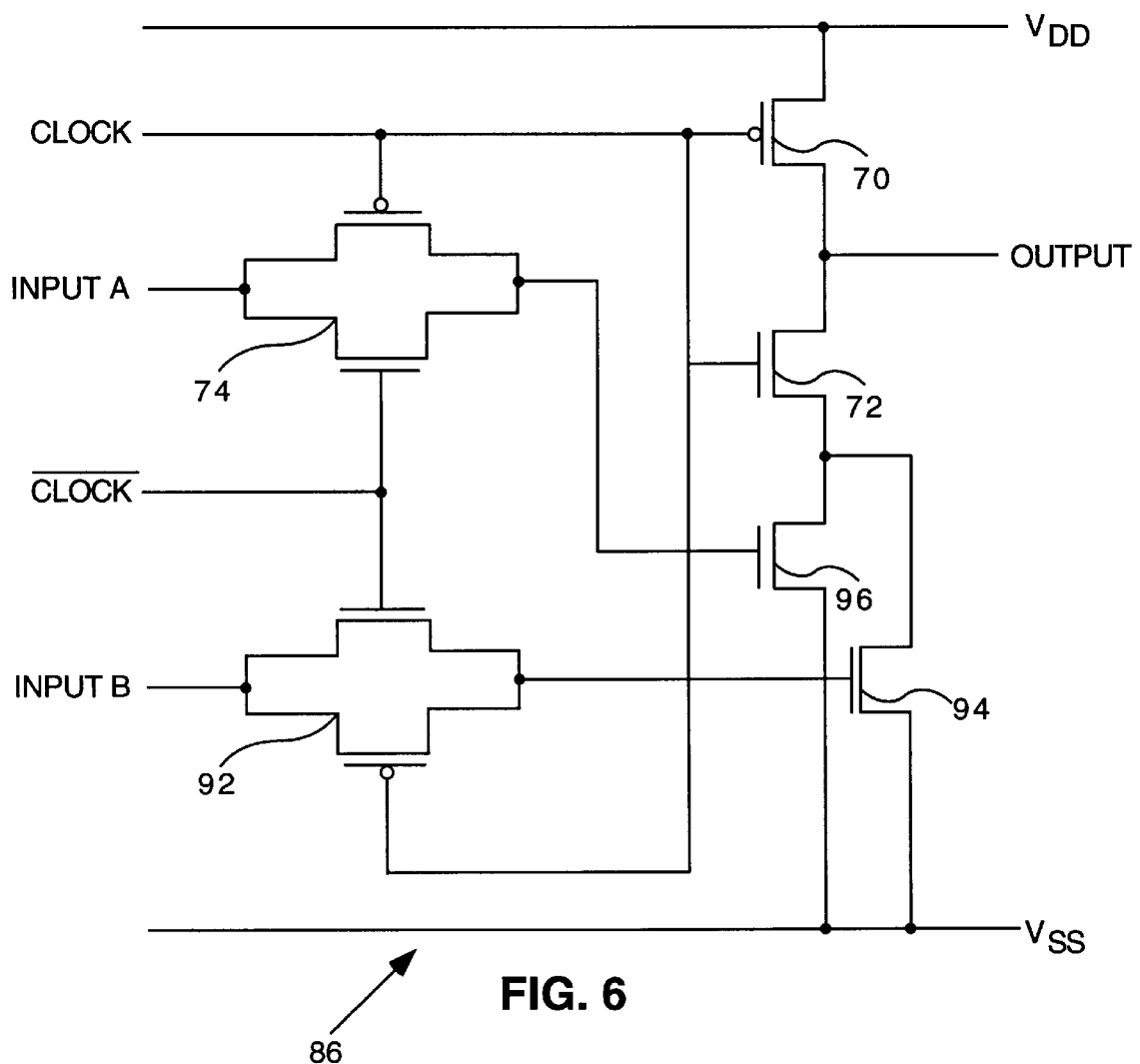
FIG. 6 schematically illustrates a GaAs C-HIGFET TPDL gate that performs the 2-input NOR function according to the present invention.

FIG. 6 illustrates a 2-input NOR gate 86. The NOR gate 86 includes a first combination NFET/PFET pass-gate input circuit 74 connected to input A and a second combination NFET/PFET pass-gate input circuit 90 connected to input B. An NFET 94 and an NFET 96 have their sources and drains connected between $V_{ss}$ and the source of the NFET 72. The gate of the NFET 96 is connected to the output of the NFET/PFET pass-gate input circuit 74. The gate of the NFET 94 is connected to the output of the NFET/PFET pass-gate input circuit 92.

Figure 7:
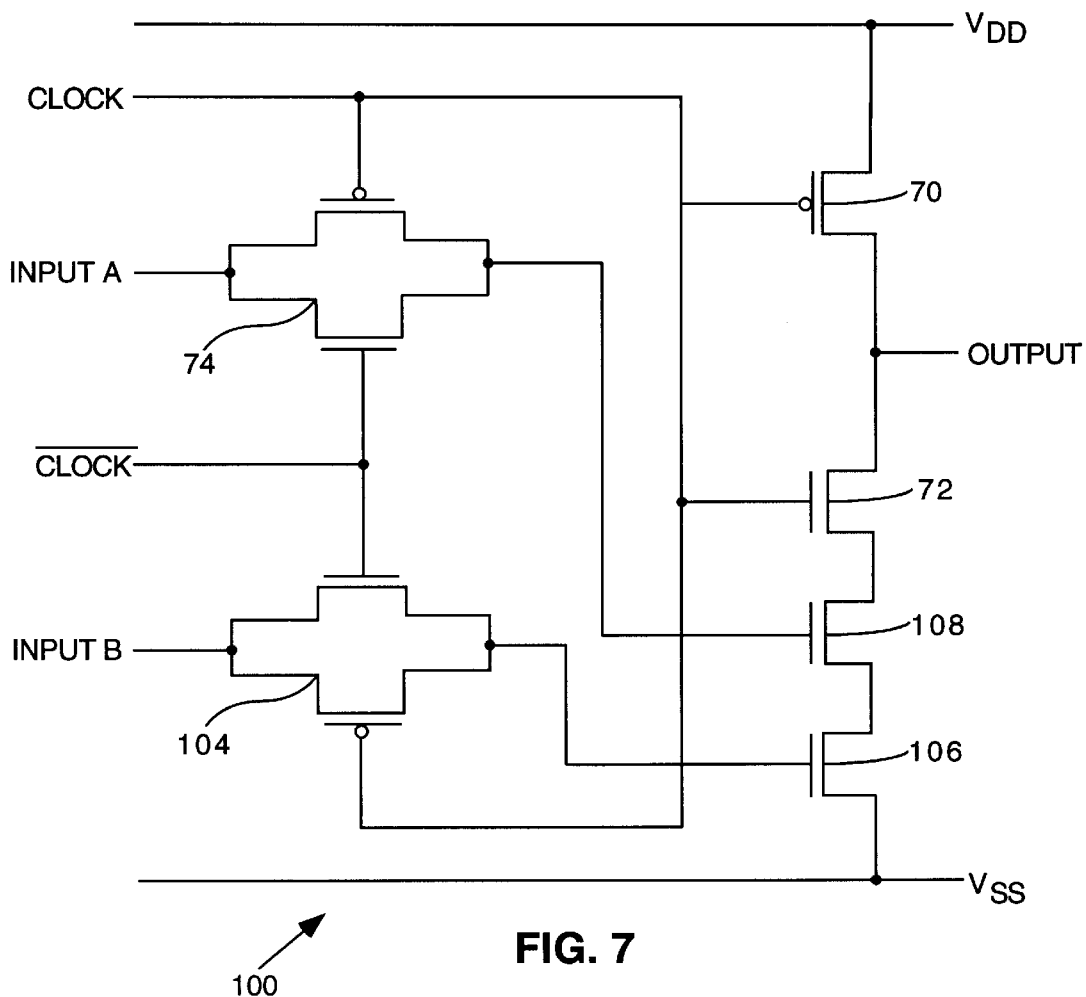
FIG. 7 schematically illustrates a GaAs C-HIGFET TPDL gate that performs 2-input NAND logic function according to the present invention.

FIG. 7 illustrates a 2-input NAND gate 100 having the NFET/PFET pass-gate input circuit 74 connected to input A and an NFET/PFET pass-gate input circuit 104 connected to input B. A pair of NFETs 106 and 108 are connected in series between the source of the NFET 72 and $V_{ss}$. The gates of the NFETs 106 and 108 are connected to the output of the NFET/PFET pass-gate input circuits 104 and 74, respectively.

Figure 8:
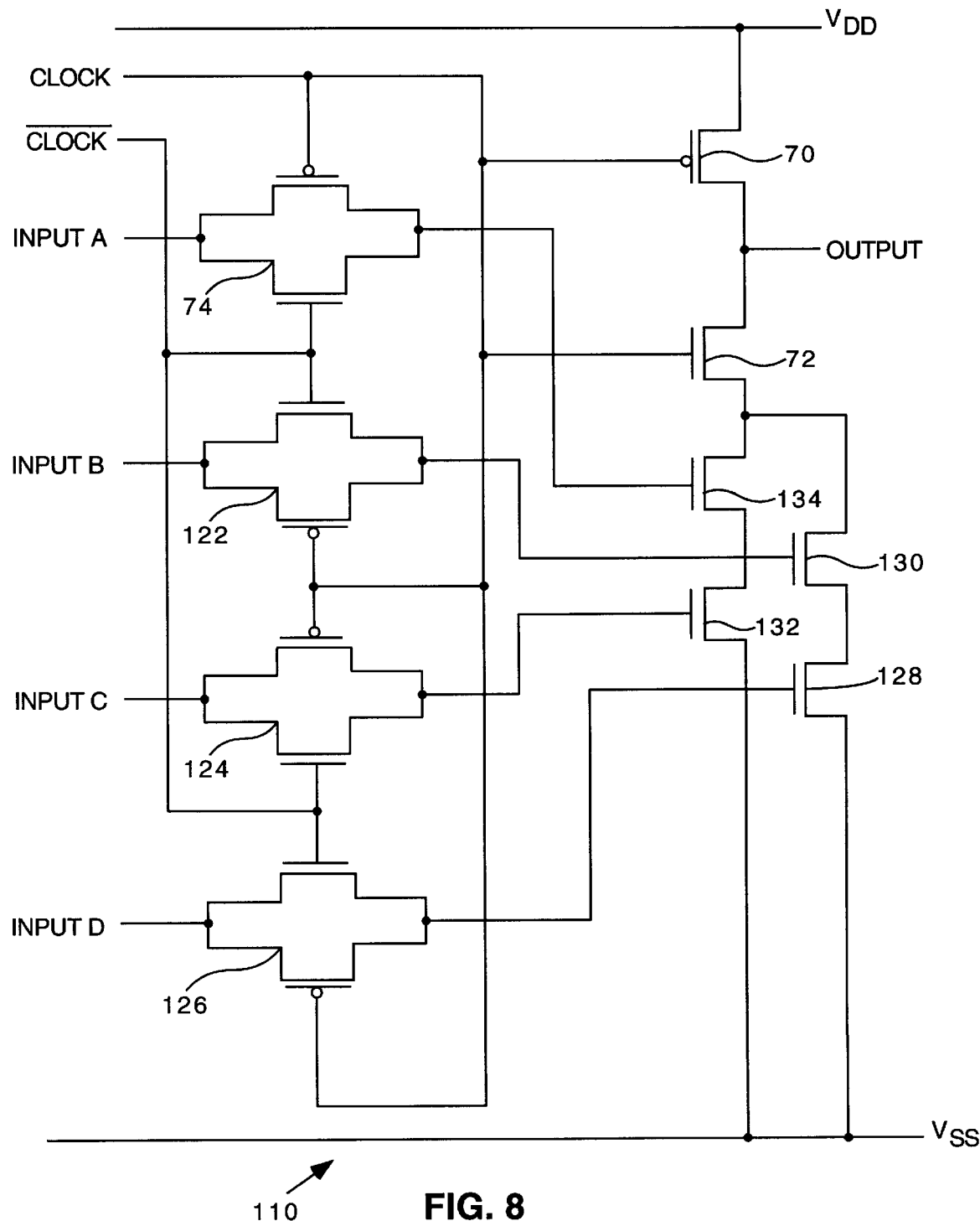
FIG. 8 schematically illustrates a GaAs C-HIGFET TPDL gate that performs the 4-input AND-OR-INVERT logic function according to the present invention.

FIG. 8 illustrates a 4-input AND-OR-INVERT gate 110 that generates the logic function f(A, B, C, D)=AC+BD. The NFET/PFET pass-gate input circuit 74 has its input connected to input A. NFET/PFET pass-gate input circuits 122, 124 and 126 have their inputs connected to inputs B, C and D, respectively. Series combinations of NFETs 128/130 and 132/134 are connected in parallel between the source of the NFET 72 and $V_{ss}$. The gates of the NFETs 128, 130, 132 and 134 are connected to the outputs of the NFET/PFET pass-gate input circuits 126, 122, 124 and 74, respectively. The gates of NFETs in the NFET/PFET pass-gate input circuits 74, 122, 124 and 126 are connected together and to the complement of the clock signal. Similarly, the gates of PFETs in the NFET/PFET pass-gate circuits 74, 122, 124 and 126 are connected together and to the clock signal.

GaAs C-HIGFET TPDL is classified as dynamic logic because a clock signal is required for proper operation of circuits that include this type of logic. The clock signal controls precharging of the output node, the logical evaluation of input signal(s), and generation of the output signal. Referring to FIG. 4, when the clock signal is low, the PFET 70 is turned on to precharge the output node. The NFET 72 is turned off to prevent the output node from discharging to ground through the NFET logic block 80 in case one or more of the transistors in the NFET logic block 80 are turned on. This also prevents static current flow from $V_{SS}$ to $V_{DD}$ during the precharge phase, thus greatly reducing power consumption. During this precharge phase, the pass gate(s) on the input signal(s) are enabled, allowing the input signal (s) to charge or discharge the gate capacitance of the transistors in the NFET logic block. Thus, if an input is low, the associated transistor in the NFET logic block 80 is turned off and if an input is high, the associated transistor in the NFET logic block 80 is turned on. When the clock signal goes high, the PFET 70 is turned off and the NFET 72 is turned on. This allows the output of the gate to conditionally discharge to $V_{SS}$ through the NFET logic block 80 if the appropriate combination of NFETs are turned on, thus evaluating the input signals and generating a valid output signal. Static current flow from $V_{DD}$ to $V_{SS}$ is prevented during this evaluate phase of the clock cycle because the NFET 70 is off at this time. Furthermore, changes to the input signals while the clock is high can not effect the output of the logic gate because all pass gates on input signals are turned off during this evaluation portion of the clock cycle.

Figure 9:
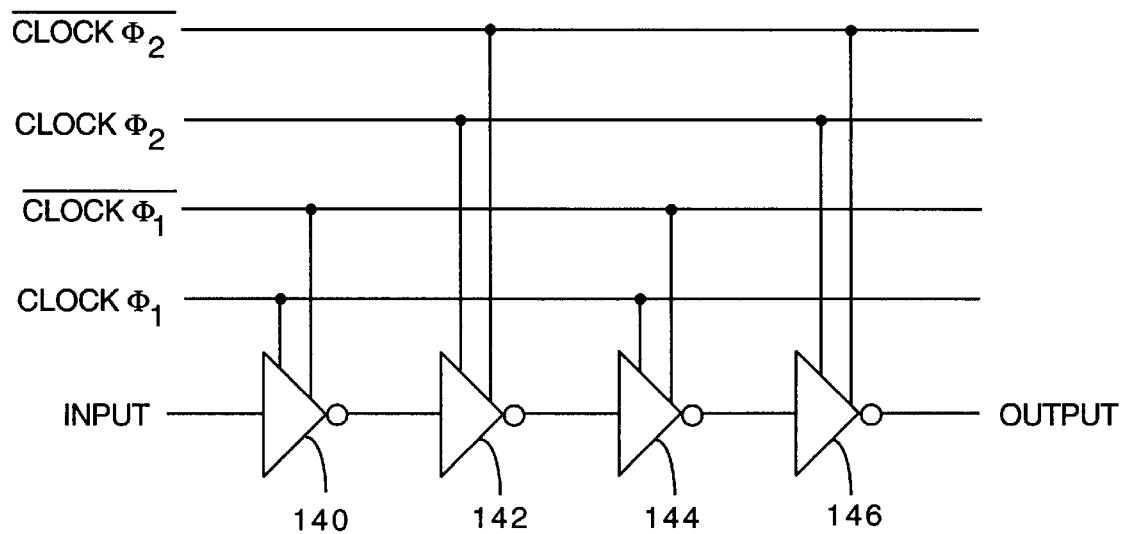
FIG. 9 schematically illustrates cascaded TPDL gates.

All TPDL gates, including those shown in FIGS. 4 through 8, can be cascaded after other TPDL gates. However, if the output signal of a TPDL gate connects to the input of another TPDL gate, then the two gates must operate off different clock phases. An example of this can be seen in FIG. 9, where four TPDL inverters 140, 142, 144 and 146 operate off two different clock signals. Referring to FIG. 9, the first and third logic stages 140 and 144, respectively, operate off clock $\Phi_1$ and its complement. The second and fourth logic stages 142 and 146, respectively, operate off clock $\Phi_2$ and its complement. If the cascade of logic gates were longer, all additional odd stages would operate off $\Phi_1$ and $\overline{\Phi}_1$ and all additional even stages would operate off $\Phi_2$ and $\overline{\Phi}_2$.

Figure 10:
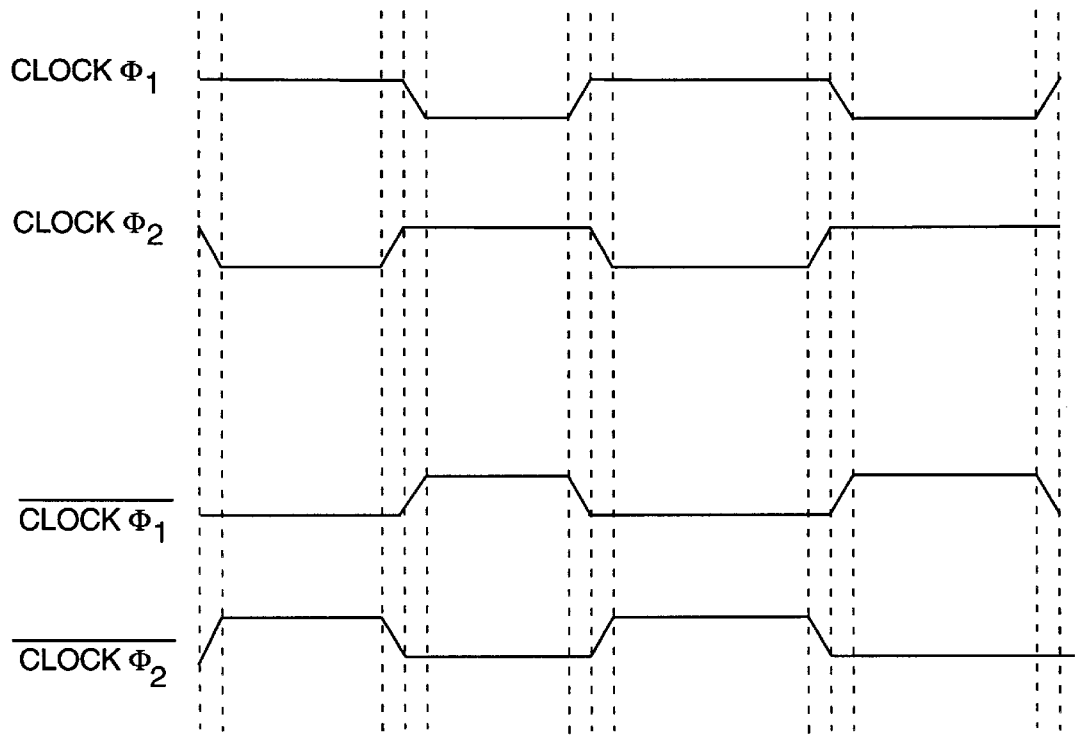
FIG. 10 is a timing diagram for two-phase non-overlapping clock signals with complements.

Clock signal timing is important for proper operation of cascaded TPDL gates. The complements of both $\Phi_1$ and $\Phi_2$ ($\overline{\Phi}_1$ and $\overline{\Phi}_2$) must be 180° out of phase with $\Phi_1$ and $\Phi_2$, respectively. Furthermore, $\Phi_1$ and $\Phi_2$ must be out of phase with each other and non-overlapping during the low portion of the clock cycle. FIG. 10 illustrates the required clock signals and their phase relationships with each other. Referring to the circuit in FIG. 9 and the clock signals in FIG. 10, when $\Phi_1$ is low, the first and third inverters 140 and 144, respectively, in FIG. 9 will precharge. When $\Phi_1$ goes high, these gates will go into the evaluation phase and latch the data that is present on their inputs. When $\Phi_2$ goes low, the second and fourth inverters 142 and 146, respectively, in FIG. 9 will precharge. When $\Phi_2$ goes high, the gates 142 and 146 go into the evaluation phase and latch the data at their inputs. The use of the two-phase non-overlapping clock signals and their complements allows each gate in the cascade to latch the data on its inputs before the logic gate supplying the data goes into the precharge phase and removes the valid data.

The TPDL circuits according to the present invention have significant advantages over the prior art. One such advantage is higher speed of operation. Two-Phase Dynamic Logic (TPDL) has the highest speed of all gallium arsenide logic families that can be considered low-power. Before the development of TPDL, the fastest, low-power, gallium arsenide logic family was complementary static logic (CSL). To compare the two families of logic together, several standard logic functions implemented in both CSL and TPDL are required. Such a comparison has been conducted and reported. The results of this study are summarized in Table 1. In this comparison, four, two-level logic functions are used, representing the four different types of two-level logic functions, sum-of-product, product-of-sum, sum-of-sum, and product-of-product. In addition to these four basic, two-level logic functions, two D-type flip flops, two 4bit linear feedback shift registers (LFSRs), and two 4-bit carry lookahead adders are also compared against each other. The D-type flip flops and the 4bit linear feedback shift registers are important circuits for comparing speed because they are both frequently used in synchronous digital systems. The carry lookahead adders are important because they are an integral part of most computers and many other types of digital systems. It can be seen from Table 1 that TPDL is significantly faster than CSL for all of the logic functions tested.

Another advantage of logic gates formed in accordance with the present invention is low power consumption. Power consumption is an extremely important parameter for digital ICs in computers and other digital systems in spacecraft, aeronautical, mobile, portable, and weapons applications. Before the development of TPDL, CSL implemented with GaAs C-HIGFETs had the lowest power consumption of all types of high-speed logic. However, TPDL consumes significantly less power than CSL, as can be seen from Table 2. For all of the different logic functions listed in Table 2 except the carry lookahead adder, the TPDL circuits consume less than one-third the power of the complementary static circuits. For some of these circuits, the power consumption advantage of TPDL is over five times.

Comparing the power consumption numbers in Table 2 for the 4-bit carry lookahead adder indicates that the static complementary logic is superior to TPDL. However, a direct comparison for this circuit is misleading because the power consumption number in Table 2 for the TPDL 4-bit carry lookahead adder includes the power consumption of the clock generation and distribution circuit. This circuit consumes approximately 25 mW when operating at a frequency of 1 GHz. In an actual system, this power consumption would be distributed throughout many circuits operating off the same clock signals. Furthermore, with a carry lookahead adder implemented with static complementary logic, there would also be some power consumption associated with a clock generation and distribution circuit.

Another reason for the discrepancy in the power consumption values for the carry lookahead adder circuits is that the values given in Table 2 assume a power supply voltage of 1.75 V. This is the voltage at which the CSL adder achieves its highest speed. However, it is not the optimum power supply voltage for the TPDL adder when operated in this speed range, which is significantly less than the maximum operating speed of the TPDL adder. If the power supply voltage for the TPDL adder were lowered to 1.0 V then it would still operate at a maximum speed of 0.292 GHz, which is faster than the CSL adder operating with a 1.75 V power supply. However, when operating at 0.292 GHz with a 1.0 V supply, the TPDL adder only consumes 2.10 mW of power. Thus, when comparing adder circuits of approximately equal speed, the CSL circuit consumes approximately twelve times more power than the TPDL circuit.

The TPDL logic circuits according to the present invention have low power-delay products. Most GaAs logic circuits will provide higher speed if operated with a higher power supply voltage. The disadvantage of using a higher power supply voltage is that power consumption is increased. As power supply voltage is increased, a point of diminishing returns is quickly reached. Furthermore, when comparing two different types of logic circuits operating at the same power supply voltage, the circuit with the higher speed will frequently have the higher power consumption. For these reasons, a popular and useful metric for comparing logic circuits against each other is the power-delay product. The power delay product refers to the product of the power consumption and the logic gate propagation delay, which is the reciprocal of the maximum frequencies of operation given in Table 1. For the power-delay product, a lower value is better.

Table 3 shows the power-delay products for both GaAs C-HIGFET TPDL and CSL for the same functions as listed in Tables 1 and 2. It can be seen from Table 3 that TPDL is superior to CSL for all of the logic functions, reaching a maximum for logic function F3, where the power-delay product for CSL is over 16 times that of TPDL.

As with Table 2, the value in Table 3 for the TPDL 4-bit carry lookahead adder includes the power consumed by the clock generation and distribution logic. It also assumes the TPDL logic is operating at maximum speed using a 1.75 V power supply. As mentioned previously, if operated using a 1.0 V power supply, the TPDL adder is still faster than the CSL adder. At this power supply voltage, the TPDL power-delay product is only 7.19 mW/MHz-gate. The power-delay product for the CSL adder circuit is almost fourteen times greater than this.

Figure 11:
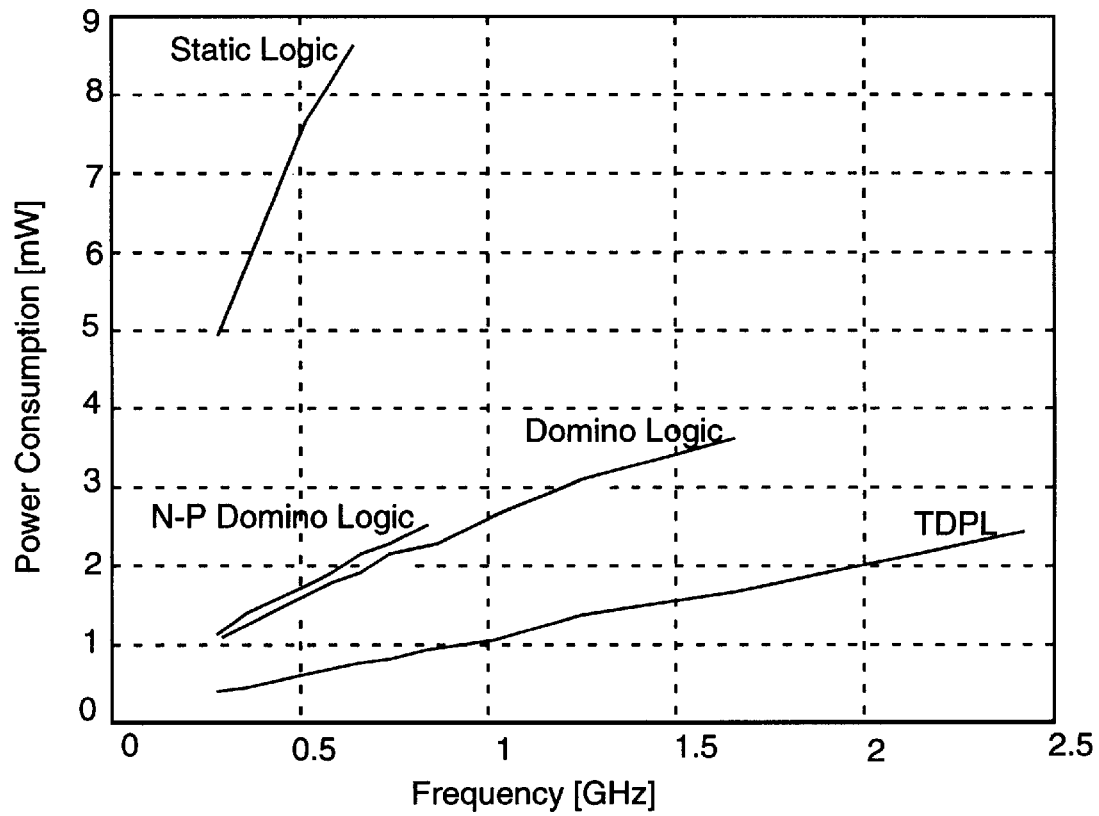
FIG. 11 graphically illustrates power consumption vs. operating frequency of GaAs C-HIGFET static logic, domino logic, N-P domino logic and TPDL logic circuits.

The superiority of TPDL over CSL can be more easily viewed with graphs. FIG. 11 graphs the power consumption vs. the maximum frequency of operation for logic function F1 for both TPDL and CSL. Also shown on the graph in FIG. 11 are plots of the power consumption vs. operating frequency of GaAs C-HIGFET Domino and N-P Domino logic circuits that also generate the logic function F1. Domino and N-P Domino logic circuits are two additional types of dynamic logic that were investigated but found to be inferior to TPDL.

Figure 12:
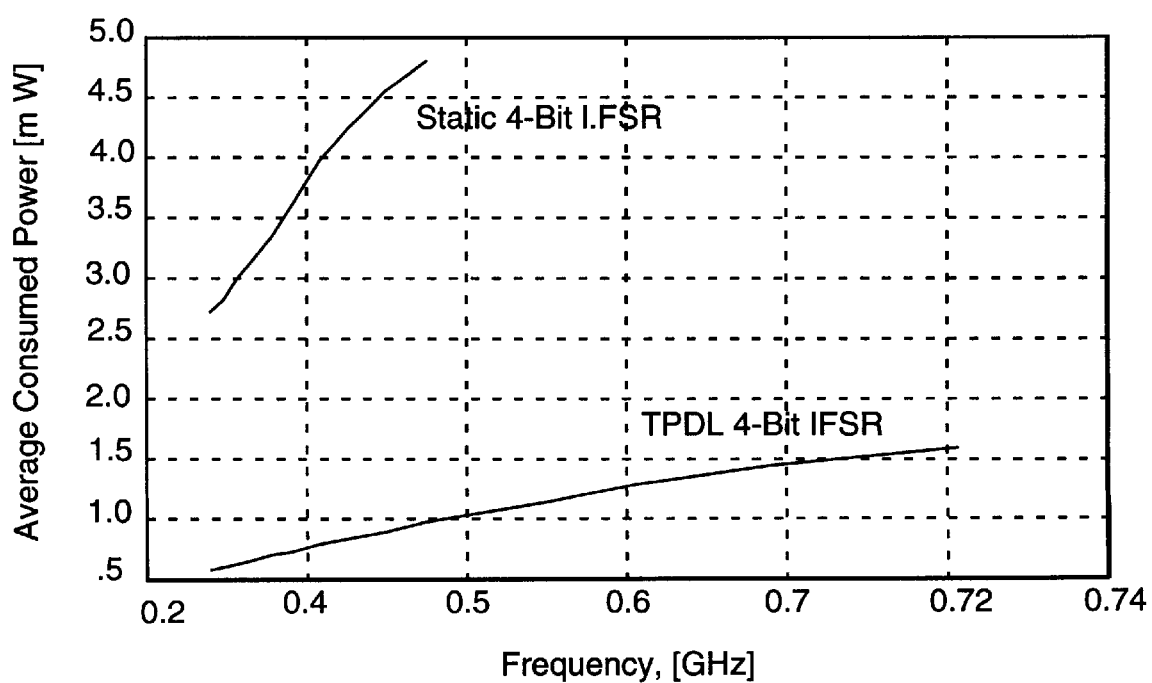
FIG. 12 graphically illustrates power consumption versus frequency of operation for two 4-bit linear feedback shift registers (LFSRs), one designed using complementary static logic and the other using TPDL.
Figure 13:
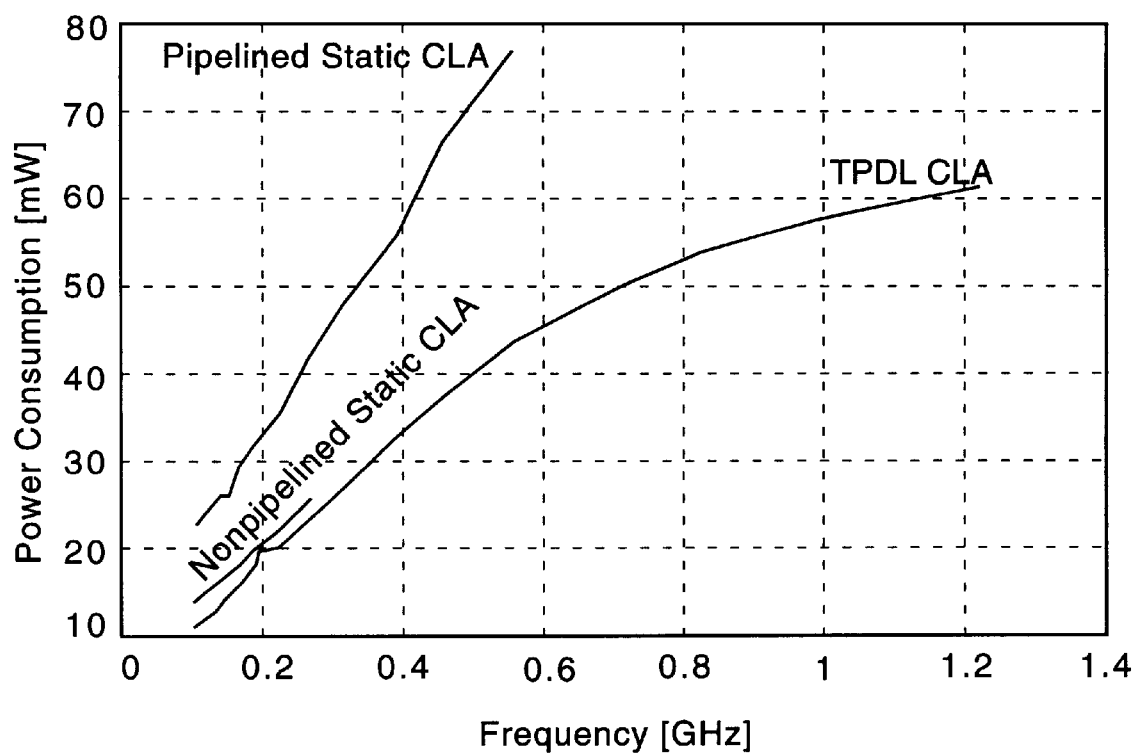
FIG. 13 graphically illustrates power consumption versus frequency of operation for three 4-bit carry look ahead adders, including a CSL adder, a pipelined CSL adder and a TPDL adder.

FIGS. 12 and 13 are also useful for understanding the operating speed and power consumption advantages of TPDL. FIG. 12 is a graph of power consumption vs. operating frequency for two, 4-bit, linear feedback shift registers, one implemented with TPDL and the other with CSL. FIG. 13 is a graph of power consumption vs. operating frequency for three 4-bit, carry lookahead adders, including one implemented with TPDL and one with CSL. This graph also includes data for a pipelined, 4-bit, carry lookahead adder implemented with CSL. This circuit is able to achieve higher speeds than the unpipelined CSL adder but at much higher power consumption. However, the maximum speed of operation for the pipelined adder is still significantly less than for the TPDL 4-bit, carry lookahead adder.

TPDL logic circuits according to the present invention have compact layout areas. An important issue for all digital ICs, Si, GaAs, static, or dynamic, is the required layout area for a specific logic function. The less layout area required for a logic function, the more functions can be put on each IC.

Furthermore, compact layout leads to shorter interconnect which has less propagation delay, as well as less parasitic capacitance which reduces the RC delay.

Two metrics that can be used for evaluating the layout area of a circuit that performs a specific logic function are the total number of transistors required to implement the function and the total transistor gate area. Table 4 summarizes the required number of transistors and the total transistor gate area for each of the logic functions listed in Tables 1, 2, and 3. When comparing two different circuits within the same logic family against each other for layout area, the total number of transistors can often be used. However, when comparing two different circuits from two different logic families against each other for layout area, counting the number of transistors can be misleading. The reason for this is that some logic families, such as CSL, require transistors that are much larger than minimum size. However, some logic circuits, such as TPDL, operate optimally with minimum-sized transistors. This can be easily viewed in Table 4. For many of the logic functions listed, CSL circuits require fewer transistors than do the TPDL circuits. All of the circuits where TPDL requires fewer transistors than CSL implement logic functions that have memory, or state information. TPDL circuits have an advantage for these types of logic functions because there is inherent data storage capability in every logic gate. It is important to note the total transistor gate areas listed in Table 4. For most of the logic functions, TPDL has a noticeable advantage. The only circuit where it does not initially appear to have an advantage is the carry lookahead adder. However, the data in Table 4 includes the transistors and layout area for the clock signal generation and distribution circuits. In an actual IC, the layout area cost of these circuits would be distributed across many other logic circuits.

The present invention provides high logic function density. Logic function density refers to the number of different logic functions that can be implemented in a specified physical area. It is advantageous for digital ICs to maximize logic function density because increased logic function density increases the capabilities of VLSI chips and also leads to speed increases.

There are two factors which limit logic function density. The first is the layout area of each logic function. It has already been shown that TPDL is superior to CSL with respect to this parameter. The other parameter that effects logic function density is the power density. This is the amount of power consumed per unit area. If the power density is too high then the IC will become to hot and will destroy itself if the chip is not actively cooled with a heat pump. However, heat pumps can drive up system costs considerably and are not a viable option for spacecraft, aeronautical, mobile, portable, and weapons applications. It has been mentioned previously that TDFL consumes significantly less power than does static complementary logic for a specified logic function operating at a specified speed. This leads to a reduced power density for TPDL when compared to static complementary logic, despite the fact that many TPDL logic circuits require less layout area than do the corresponding static complementary circuits. In essence, the rate at which power decreases is greater than the rate at which layout area decreases.

TPDL logic circuits according to the present invention are ideal for pipelined and systolic architectures. It has been mentioned previously that TPDL has inherent data storage capability, otherwise known as memory or state, that is built in to every logic gate. This is because of the fact that TPDL can store a charge, representing a logic value, on the output of each logic gate until it begins the next precharge phase. However, before the value is corrupted by the next precharge phase, the logic value is latched by the input pass gates of cascaded logic stages. This inherent data storage capability makes TPDL ideal for any application requiring a pipelined or systolic system-level architecture. No additional data storage registers or control signals are necessary, only the normally-required, two-phase, non-overlapping clocks and their complements. The use of TPDL in pipelined and systolic systems will decrease the parts count, power consumption, weight, and size of pipelined and systolic systems, as well as increase the speed and reliability.

Table 5 illustrates the advantages of TPDL for pipelined systems. It can be seen from Table 5 that with pipelining circuits, the frequency of operation of a CSL carry lookahead adder can be approximately doubled. However, this increase in performance comes at a cost of approximately twice as many transistors, twice as much layout area, and over three times as much power. Yet, the pipelined static adder is less than half the speed of the TPDL adder that is inherently pipelined. It can be seen from Table 5 that the transistor count, layout area, and power consumption of the TPDL adder are all superior to the pipelined CSL adder.

The present invention provides logic circuitry having several new features that were previously unknown in the art. These new features include:

1. The Two-Phase Dynamic Logic (TPDL) circuit topology for implementing dynamic logic using GaAs C-HIGFETs.

2. The use of multi-phase clock signals for eliminating static current flow and short-circuit current flow in logic circuits implemented with GaAs C-HIGFETs.

3. The use of multi-phase clock signals for controlling the precharging, evaluation, and output signal generation of dynamic logic circuits implemented with GaAs C-HIGFETs.

4. The use of two-phase non-overlapping clock signals and their complements for controlling the precharging, evaluation, and output signal generation of dynamic logic circuits implemented with GaAs C-HIGFETs.

5. The use of two-phase non-overlapping clock signals for controlling the precharging, evaluation, and output signal generation of dynamic logic circuits implemented with GaAs C-HIGFETs.

6. The use of pass gates controlled by clock signals at logic gate inputs for latching input data to the logic gate in a GaAs C-HIGFET dynamic logic circuit.

7. The use of a clocked, P-type, GaAs, HIGFET for controlling the precharging of the output node of a GaAs C-HIGFET dynamic logic circuit. It has also been shown that an N-type HIGFET can be used, although the use of a P-type HIGFET is superior.

8. The use of a clocked, N-type, GaAs, HIGFET for controlling the evaluation of a logic expression and the generation of a valid output signal in a GaAs C-HIGFET dynamic logic circuit. It has also been shown that a P-type HIGFET can be used, although the use of an N-type HIGFET is superior.

Exemplary embodiments of the invention are disclosed herein to explain how to make and use the invention. In actual practice, modifications may be made. The described embodiments are to be considered in all respects as exemplary and illustrative rather than restrictive. Therefore, the appended claims rather than the foregoing descriptions define the scope of the invention. All modifications to the embodiments described herein that come within the meaning and ranges of equivalence of the claims are embraced within the scope of the invention.

TABLE 1

Speed Comparison of GaAs C-HIGFET TPDL and CSL

| Logic Function | TPDL Maximum Frequency | CSL Maximum Frequency |
|---|---|---|
| $F_1(A,B,C) = (\text{fheight}\overline{(A + B)} + C)$ | 2.38 GHz | 0.62 GHz |
| $F_2(A,B,C) = (\text{fheight}\overline{(A \cdot B)} \cdot C)$ | 1.92 GHz | 0.83 GHz |
| $F_3(A,B,C) = (\text{fheight}\overline{(A + B)} \cdot C)$ | 1.92 GHz | 0.62 GHz |
| $F_4(A,B,C) = (\text{fheight}\overline{(A \cdot B)} + C)$ | 1.92 GHz | 0.62 GHz |
| D-type Flip Flop | 2.0 GHz | 0.82 GHz |
| 4-bit Linear Feedback Shift Register | 1.2 GHz | 0.55 GHz |
| 4-Bit Carry Lookahead Adder | 1.2 GHz | 0.26 GHz |

TABLE 2

Power Consumption Comparison of GaAs C-HIGFET TPDL and CSL at Maximum Operating Frequency of Each Technology

| Logic Function | TPDL Power Consumption | CSL Power Consumption |
|---|---|---|
| $F_1(A,B,C) = (\text{fheight}\overline{(A + B)} + C)$ | 2.38 mW | 8.69 mW |
| $F_2(A,B,C) = (\text{fheight}\overline{(A \cdot B)} \cdot C)$ | 1.82 mW | 10.39 mW |
| $F_3(A,B,C) = (\text{fheight}\overline{(A + B)} \cdot C)$ | 1.75 mW | 9.49 mW |
| $F_4(A,B,C) = (\text{fheight}\overline{(A \cdot B)} + C)$ | 1.82 mW | 8.73 mW |
| D-type Flip Flop | 4.54 mW | 20.8 mW |
| 4-bit Linear Feedback Shift Register | 15.89 mW | 48.2 mW |
| 4-Bit Carry Lookahead Adder | 61.79 mW | 26 mW |

TABLE 3

Power-Delay Product for GaAs C-HIGFET TPDL and CSL Circuits

| Logic Function | TPDL Power Consumption ($\mu$W/MHz-gate) | CSL Power Consumption ($\mu$W/MHz-gate) |
|---|---|---|
| $F_1(A,B,C) = (\overline{(A + B)} + C)$ | 1.0 | 14.02 |
| $F_2(A,B,C) = (\overline{(A \cdot B)} \cdot C)$ | 0.95 | 12.52 |
| $F_3(A,B,C) = (\overline{(A + B)} \cdot C)$ | 0.91 | 15.31 |
| $F_4(A,B,C) = (\overline{(A \cdot B)} + C)$ | 0.95 | 14.08 |
| D-type Flip Flop | 4.54 | 25.37 |
| 4-bit Linear Feedback Shift Register | 13.24 | 87.64 |
| 4-Bit Carry Lookahead Adder | 50.65 | 100 |

TABLE 4

Transistor Count and Transistor Gate Area for TPDL and CSL Circuits

| | TPDL | | CSL | |
|---|---|---|---|---|
| Logic Function | Number of transistors | Transistor Gate Area | Number of transistors | Transistor Gate Area |
| $F_1(A,B,C) = (\text{fheight}\overline{(A + B)} + C)$ | 16 | 25.2 $\mu$m$^2$ | 8 | 56 $\mu$m$^2$ |
| $F_2(A,B,C) = (\text{fheight}\overline{(A \cdot B)} \cdot C)$ | 16 | 25.2 $\mu$m$^2$ | 8 | 56 $\mu$m$^2$ |
| $F_3(A,B,C) = (\text{fheight}\overline{(A + B)} \cdot C)$ | 16 | 25.2 $\mu$m$^2$ | 8 | 56 $\mu$m$^2$ |
| $F_4(A,B,C) = (\text{fheight}\overline{(A \cdot B)} + C)$ | 16 | 25.2 $\mu$m$^2$ | 8 | 56 $\mu$m$^2$ |
| D-type Flip Flop | 10 | 23.8 $\mu$m$^2$ | 20 | 112 $\mu$m$^2$ |
| 4-bit Linear Feedback Shift Register | 54 | 143.5 $\mu$m$^2$ | 88 | 490 $\mu$m$^2$ |
| 4-Bit Carry Lookahead Adder | 450 | 1109.5 $\mu$m$^2$ | 236 | 989 $\mu$m$^2$ |

TABLE 5

Comparison of CSL, pipelined CSL and Inherently Pipelined TPDL 4-bit carry Lookahead Adders

| Logic Family | Maximum Frequency | Power Consumption | Layout Area | Transistor Count |
|---|---|---|---|---|
| 4-Bit Static CLA | 0.26 GHz | 26 mW | 989 $\mu$m$^2$ | 236 |
| 4-Bit Pipelined Static CLA | 0.55 GHz | 77.4 mW | 1853 $\mu$m$^2$ | 516 |
| 4-Bit TPDL CLA | 1.22 GHz | 61.79 mW | 1109.5 $\mu$m$^2$ | 450 |

What is claimed is:

1. A two-phase dynamic logic circuit for complementary GaAs HIGFET fabrication processes, comprising:

a precharge transistor connected between a precharge voltage source and an output node of the logic circuit and, the precharge transistor being controlled by a clock signal such that the output node precharges when the clock signal is low and is isolated from the precharge voltage source when the clock signal is high;

an evaluate transistor connected to the output node;

an NFET logic block comprising at least one NFET transistor, the NFET logic block having a first terminal connected to the evaluate transistor such that the evaluate transistor is between the NFET logic block and the output node, a second terminal connected to a voltage source and a data input terminal arranged to receive data input signals, the NFET logic block including at least one transistor arranged to generate a logic value, the evaluate transistor being controlled by the clock signal such that when the clock signal is low, the output node is isolated from the NFET logic block; and when the clock signal is high, the logic value generated by the NFET logic block is allowed to determine the voltage on the output node of the logic circuit;

a pass-gate arranged to receive an input signal and conditionally pass the input signal to the gate of the evaluation transistor in the NFET logic block under the control of the clock signal such that the input is allowed to influence the gate voltages of transistors in the NFET logic block when the clock signal is low, but is not allowed to influence the gate voltages of transistors in the NFET logic gate when the clock signal is high.

2. The two-phase dynamic logic circuit of claim 1 wherein the precharge transistor comprises a PFET.

3. The two-phase dynamic logic circuit of claim 1 wherein the precharge transistor comprises an NFET.

4. The two-phase dynamic logic circuit of claim 1 wherein the evaluate transistor comprises an NFET.

5. The two-phase dynamic logic circuit of claim 1 wherein the evaluate transistor comprises a PFET.

6. The two-phase dynamic logic circuit of claim 1 wherein the pass-gate circuit comprises an NFET.

7. The two-phase dynamic logic circuit of claim 1 wherein the pass-gate circuit comprises a PFET.

8. The two-phase dynamic logic circuit of claim 1 including a pass-gate circuit comprising an NFET and a PFET having their sources and drains connected together in parallel with the gate of the PFET being connected to the clock signal and the gate of the NFET being arranged to receive a complementary clock signal.

9. The two-phase dynamic logic circuit of claim 1 wherein the NFET logic block comprises an NFET having its gate connected to the to the output of the pass-gate such that the two-phase dynamic logic circuit forms a logic inverter circuit.

10. The two-phase dynamic logic circuit of claim 1, further comprising:
a plurality of pass-gate circuits, each having a corresponding signal input terminal; and
an NFET logic block with a plurality of data inputs such that each of the plurality of data inputs to the NFET logic block is connected to the output of a pass-gate.

11. The two-phase dynamic logic circuit of claim 10 including:
a first pass-gate arranged to receive a signal input A and having the gate of the PFET arranged to receive the clock signal and the gate of the NFET arranged to receive the complementary clock signal;
a second pass-gate having its input arranged to receive a signal input B and having its PFET gate connected to the PFET gate of the first pass gate and arranged to receive the clock signal and its NFET gate connected to the NFET gate of the first pass-gate and arranged to receive the complementary clock signal;
a first NFET and a second NFET having their sources and drains connected in parallel between the voltage source $V_{SS}$ and the source of the evaluate transistor, the gate of the first NFET being connected to the output of the first pass-gate circuit to receive the signal input A when the first pass-gate circuit is in the on state, the gate of the second NFET being connected to the output of the second pass-gate circuit to receive the signal input B when the second pass-gate circuit is in the on state, such that the two-phase dynamic logic circuit forms a two-input NOR gate.

12. The two-phase dynamic logic circuit of claim 10 including:
a first pass-gate arranged to receive a signal input A and having the gate of the PFET arranged to receive the clock signal and the gate of the NFET arranged to receive the complementary clock signal;
a second pass-gate arranged to receive a signal input B and having its PFET gate connected to the PFET gate of the first pass gate and arranged to receive the clock signal and its NFET gate connected to the NFET gate of the first pass-gate and arranged to receive the complementary clock signal;
a first NFET and a second NFET having their sources and drains connected in series between the voltage source $V_{SS}$ and the source of the evaluate transistor, the gate of the first NFET being connected to the output of the first pass-gate circuit to receive the signal input A when the first pass-gate circuit is in the on state, the gate of the second NFET being connected to the output of the second pass-gate circuit to receive the signal input B when the second pass-gate circuit is in the on state, such that the two-phase dynamic logic circuit forms a two-input NAND gate.

13. The two-phase dynamic logic circuit of claim 10 including:
a first pass-gate arranged to receive a signal input A and having the gate of the PFET arranged to receive the clock signal and the gate of the NFET arranged to receive the complementary clock signal;
a second pass-gate arranged to receive a signal input B and having its PFET gate connected to the PFET gate of the first pass gate and arranged to receive the clock signal and its NFET gate connected to the NFET gate of the first pass-gate and arranged to receive the complementary clock signal;
a third pass-gate arranged to receive a signal input C and having its PFET gate connected to the PFET gate of the first pass gate and arranged to receive the clock signal and its NFET gate connected to the NFET gate of the first pass-gate and arranged to receive the complementary clock signal;
a fourth pass-gate FET arranged to receive a signal input D and having its PFET gate connected to the PFET gate of the first pass gate and arranged to receive the clock signal and its NFET gate connected to the NFET gate of the first pass-gate and arranged to receive the complementary clock signal;
a first NFET and a second NFET having their sources and drains connected in series between the voltage source $V_{SS}$ and the source of the evaluate transistor;
a third NFET and a fourth NFET having their sources and drains connected in series between the voltage source $V_{SS}$ and the source of the evaluate transistor, the gate of the first NFET being connected to the output of the first pass-gate circuit to receive the signal input A when the first pass-gate circuit is in the on state, the gate of the second NFET being connected to the output of the third pass-gate circuit to receive the signal input C when the second pass-gate circuit is in the on state, the gate of the third NFET being connected to the output of the second pass-gate circuit to receive the signal input B when the second pass-gate circuit is in the on state, and the gate of the fourth NFET being connected to the output of the fourth pass-gate circuit to receive the signal input D when the fourth pass-gate circuit is in the on state such that the two-phase dynamic logic circuit forms a four-input AND-OR-INVERT gate.

* * * * *